(12) United States Patent
Yoon et al.

(10) Patent No.: US 9,172,031 B2
(45) Date of Patent: Oct. 27, 2015

(54) RESISTIVE MEMORY DEVICE

(71) Applicant: SK hynix Inc., Gyeonggi-do (KR)

(72) Inventors: Sung-Joon Yoon, Gyeonggi-do (KR); Hyung-Dong Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/692,432

(22) Filed: Apr. 21, 2015

(65) Prior Publication Data

US 2015/0228890 A1 Aug. 13, 2015

Related U.S. Application Data

(63) Continuation-in-part of application No. 13/595,324, filed on Aug. 27, 2012.

(30) Foreign Application Priority Data

May 11, 2012 (KR) .......... 10-2012-0050242

(51) Int. Cl.
*H01L 47/00* (2006.01)
*H01L 43/08* (2006.01)
*H01L 43/02* (2006.01)

(52) U.S. Cl.
CPC ............... *H01L 43/08* (2013.01); *H01L 43/02* (2013.01)

(58) Field of Classification Search
CPC ......... H01L 43/08; H01L 43/12; H01L 43/10; H01L 27/222; H01L 27/228; H01L 2924/0002; H01L 29/66984; H01L 29/82; H01L 43/02; H01L 2924/00; H01L 41/12; H01L 23/49503; H01L 27/105; H01L 27/22

USPC .............. 257/4, 421, 422, 423, 427, E45.001, 257/E29.323; 438/3
See application file for complete search history.

(56) References Cited

U.S. PATENT DOCUMENTS

| | | |
|---|---|---|
| 2006/0087921 A1 | 4/2006 | Iwasaki |
| 2010/0073997 A1 | 3/2010 | Elmegreen et al. |
| 2011/0161605 A1 | 6/2011 | Lee et al. |
| 2012/0147666 A1 | 6/2012 | Dubourdieu et al. |
| 2013/0062714 A1 | 3/2013 | Zhu et al. |

FOREIGN PATENT DOCUMENTS

KR 1020070069160 7/2007

OTHER PUBLICATIONS

Ghani, T., et al. A 90nm high volume manufacturing logic technology featuring novel 45nm gate length strained silicon CMOS transistors, IEEE International Electron Devices Meeting, 2003, pp. 11.6.1-11.6.3.

Madakson, P., et al. Stresses and radiation damage in Ar+ and Ti+ ion-implanted silicon, Journal of Applied Physics, 1987, pp. 1688-1693, vol. 62, No. 5.

(Continued)

*Primary Examiner* — Mark A Laurenzi
(74) *Attorney, Agent, or Firm* — IP & T Group LLP

(57) ABSTRACT

A resistive memory device includes: a resistive layer which includes a first magnetic layer, a second magnetic layer, and a tunnel insulating layer interposed between the first magnetic layer and the second magnetic layer, and is switched between different resistance states; and a strained film formed over a sidewall of the resistive layer and applying a strain to the resistive layer, wherein the strained film includes a semiconductor material containing ions implanted therein

13 Claims, 8 Drawing Sheets

(56) References Cited

OTHER PUBLICATIONS

Tyagi, S., et al., An advanced low power, high performance, strained channel 65nm technology, 2005 Electron Devices Meeting, IEDM Technical Digest, IEEE International, 2005.

Mistry, K., et al., Delaying forever: Uniaxial strained silicon transistors in a 90nm CMOS technology, 2004 Symposium on VLSI Technology Digest of Technical Papers, 2004, pp. 50-51.

Wang, D., et al., Magnetostriction effect of amorphous CoFeB thin films and application in spin-dependent tunnel junctions, Journal of Applied Physics, 2005, pp. 10C906-1-10C906-3, vol. 97.

Office Action issued by the USPTO for the parent U.S. Appl. No. 13/595,324 on Apr. 27, 2015.

RESISTIVE MEMORY DEVICE

CROSS-REFERENCE TO RELATED APPLICATIONS

The present application is a continuation-in-part of U.S. patent application Ser. No. 13/595,324 filed on Aug. 27, 2012, which claims priority of Korean Patent Application No. 10-2012-0050242, filed on May 11, 2012. Each of these applications is incorporated herein by reference in its entirety.

BACKGROUND

1. Field

Exemplary embodiments of the present invention relate to a resistive memory device, and more particularly, to a resistive memory device including a resistive layer having a resistance change characteristic for a memory layer.

2. Description of the Related Art

A nonvolatile memory device may include a magnetic random access memory (MRAM), a ferroelectric random access memory (FeRAM), a phase-change random access memory (PCRAM), a resistance random access memory (ReRAM) and the like. Here, the ReRAM (i.e., a resistive memory device) stores data corresponding to '1' or '0', using a resistance change characteristic. When a voltage equal to or more than a set voltage is applied to a resistance change material, the resistance of the resistance change material decreases. This state may be referred to as an ON state. Furthermore, when a voltage equal to or more than a reset voltage is applied to the resistance change material, the resistance of the resistance change material increases. This state may be referred to as an OFF state.

Thus, a resistive memory device has a characteristic of switching to the low-resistance state or the high-resistance state. Here, a method for improving the switching characteristic is useful.

SUMMARY

An embodiment of the present invention is directed to a resistive memory device capable of reducing an operation voltage while maintaining or improving a switching characteristic in a resistance state.

In accordance with an embodiment of the present invention, a resistive memory device includes a memory cell comprising first and second electrodes and a resistive layer formed therebetween, wherein the resistive layer is formed of a resistance change material, and a strained film formed adjacent to the resistive layer and configured to apply a strain to the resistive layer.

In accordance with another embodiment of the present invention, a resistive memory device includes: a plurality of first conductive lines arranged in parallel to each other; a plurality of second conductive lines crossing the first conductive lines and arranged in parallel to each other; and a plurality of memory cells formed at each intersection between the first and second conductive lines. The memory cells each include first and second electrodes and a resistive layer formed between the first and second electrodes and the resistive layer includes a resistance change material, and the resistive memory device further includes a strained film formed adjacent to the resistive layer and configured to apply a strain to the resistive layer.

In accordance with another embodiment of the present invention, a resistive memory device includes: a resistive layer which includes a first magnetic layer, a second magnetic layer, and a tunnel insulating layer interposed between the first magnetic layer and the second magnetic layer, and is switched between different resistance states; and a strained film formed over a sidewall of the resistive layer and applying a strain to the resistive layer, wherein the strained film include a semiconductor material containing ions implanted therein.

DETAILED DESCRIPTION

Figure 1A:
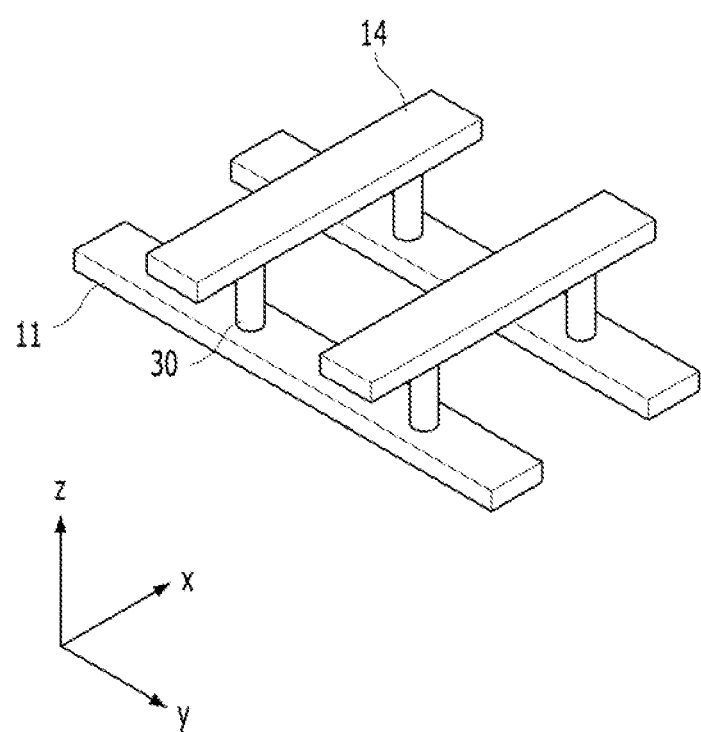
FIG. 1A is a perspective view of a resistive memory device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 1B:
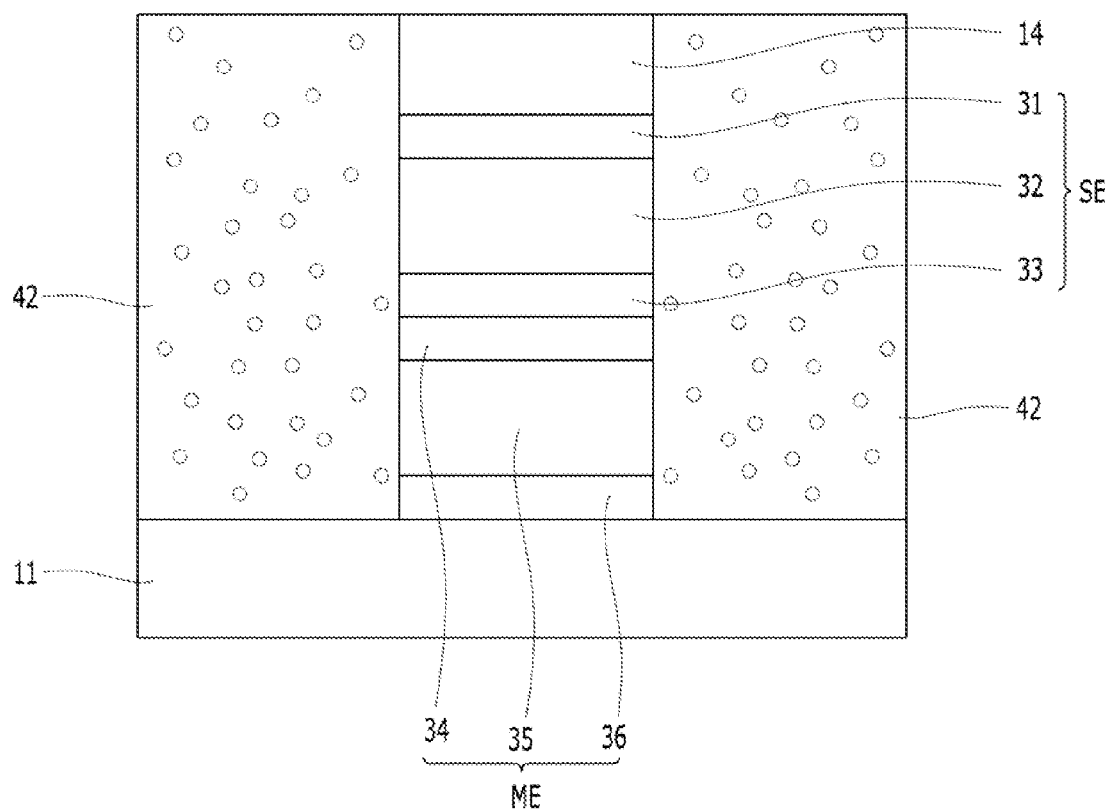
FIG. 1B is a cross-sectional view of any one cell of the resistive memory device of FIG. 1A, taken along the Z axis.

FIG. 1A is a perspective view of a resistive memory device in accordance with an embodiment of the present invention. FIG. 1B is a cross-sectional view of any one cell of the resistive memory device of FIG. 1A, taken along the Z axis.

FIGS. 1A and 1B illustrate a memory cell array having a crossbar structure. The crossbar structure includes a plurality of first conductive lines formed in parallel to each other, a plurality of second conductive lines crossing the first conductive lines and formed in parallel to each other, and a plurality of resistance elements formed at the respective intersections between the first and second conductive lines. The crossbar structure facilitates a high integration of the memory cell array.

Referring to FIG. 1A, a first conductive line 11 is formed over a substrate (not illustrated) having a desired lower structure formed therein. Here, the first conductive line 11 may be formed of a metal such as Al, W, or Cu. For example, a plurality of first conductive lines may be formed in parallel to each other in the Y-axis direction. Over the first conductive line 11, a second conductive line 14 may be formed in a direction crossing the first conductive line 11, that is, in the X-axis direction, while spaced at a desired distance from the first conductive line 11. Here, the second conductive line 14 may be formed of a metal such as Al, W, or Cu. For example, a plurality of second conductive lines may be formed in parallel to each other. Furthermore, memory cells 30 may be formed at the respective intersections/junctions between the first and second conductive lines 11 and 14.

Referring to FIG. 1B, the memory cell 30 may include a memory element ME and a switching element SE. The memory element ME may include a first electrode 36, a resistive layer 35, and a second electrode 34, which are stacked over the first conductive line 11. The switching element SE is an element for accessing a specific cell within the memory cell array and serves to control a signal access. The switching element SE may have a stacked structure of a lower electrode 33, a switching layer 32, and an upper electrode 31. In this embodiment of the present invention, the switching element SE may be omitted. Furthermore, although the switching element SE is shown to be positioned over the memory element ME, the switching element SE may be positioned under the memory element ME. The memory cell 30 may be any reasonably suitable memory cell for storing data.

The resistive layer 35 of the memory element ME has a tensile or compressive strain. That is, the resistive layer 35 may include a tensile strained resistive layer or a compressive strained resistive layer.

Here, a switching operation of the resistive layer 35 (that is, a resistance state change) is performed by movement of oxygen ions or oxygen vacancies. Therefore, when a strain is applied to the resistive layer 35, the mobility of oxygen ions (or oxygen vacancies) within the resistive layer may be improved. More specifically, when major carriers of the resistive layer material are oxygen ions, the memory element ME is configured to have a tensile strained resistive layer. On the other hand, when the major carriers of the resistive layer material are oxygen vacancies, the memory element ME is configured to have a compressive strained resistive layer. The strained resistive layer may improve the carrier mobility. When the carrier mobility is improved, a larger amount of current may be passed at the same voltage. Therefore, set and reset voltages for supplying a current in the switching operation may be decreased.

Referring to FIG. 1B, the resistive layer 35 of the memory element ME is surrounded by an insulation layer 42 having a strain. The insulation layer 42 may include a single layer or multiple layers. The insulation layer 42 is not illustrated in FIG. 1A.

In this embodiment of the present invention, the insulation layer 42 has a complementary strain to the strain of the resistive layer 35. The insulation layer 42 is formed adjacent to the resistive layer 35. Therefore, when a strain is applied to the insulation layer 42, the resistive layer 35 has an opposite strain to the insulation layer 42. More specifically, when the resistive layer 35 is formed of a tensile strained resistive layer, the insulation layer 42 surrounding the resistive layer 35 may be formed to have a compressive strain. Furthermore, when the resistive layer 35 is formed of a compressive strained resistive layer, the insulation layer 42 surrounding the resistive layer 35 may be formed to have a tensile strain.

In this embodiment of the present invention, the resistive layer 35 may be formed of a metal oxide. For example, the metal oxide may include one or more of a Ta oxide, Zr oxide, yttria-stabilized zirconia (YSZ), Ti oxide, Hf oxide, Mn oxide, Mg oxide, and alloys thereof. Furthermore, the resistive layer 35 may have a stacked structure of layers of homogeneous or heterogeneous metal oxides.

The insulation layer 42 having a strain may be formed of various materials. Furthermore, the insulation layer 42 may include a single layer or multiple layers. For example, the insulation layer 42 may be formed of an oxide or a nitride. More specifically, the insulation layer 42 may be formed of a silicon oxide or a silicon nitride. The insulation layer 42 may be any reasonably suitable insulation layer that has a compressive (or tensile) strain so as to apply a tensile (or compressive) strain to the resistive layer 35. The insulation layer 42 having a strain may be formed by any reasonable method such as the ones described below.

Figure 2:
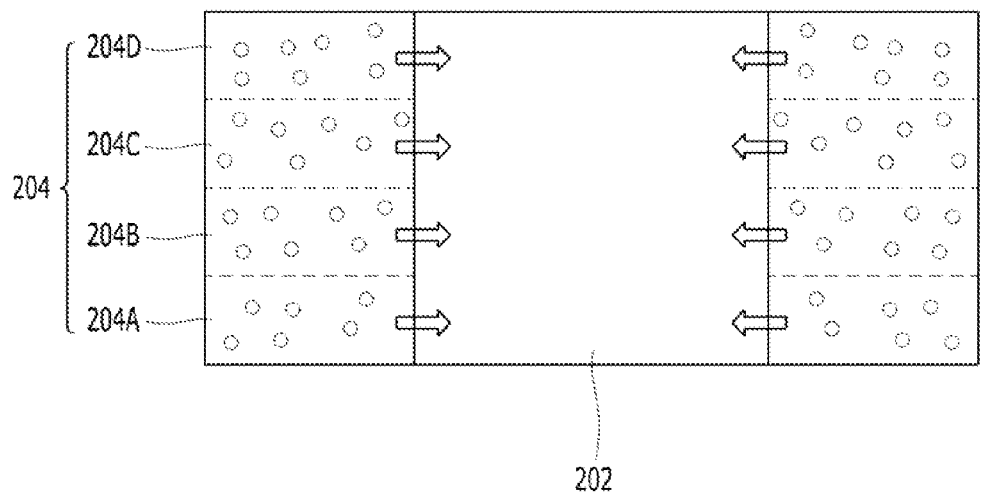
FIGS. 2 to 5 are cross-sectional views illustrating materials and structures of various insulation layers for applying a strain to a resistive layer.
Figure 3:
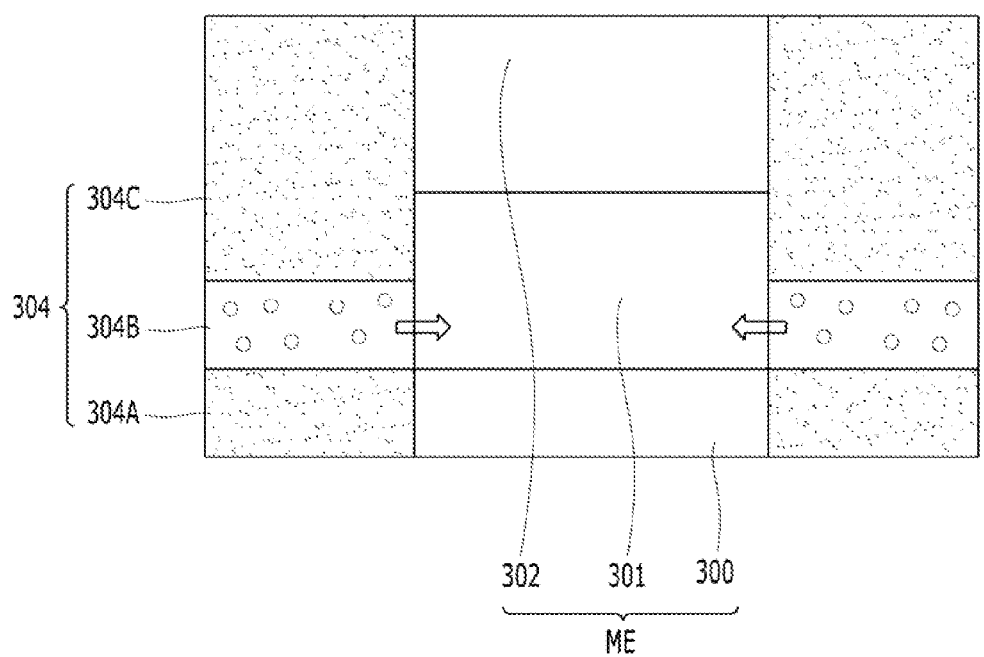

FIGS. 2 and 3 are cross-sectional views illustrating materials and structures of various insulation layers for applying a strain to the resistive layer.

FIGS. 2 and 3 illustrate a method that oxidizes and/or nitrifies a thin film deposited for an insulation layer such that the insulation layer has a strain.

Specifically, referring to FIG. 2, an insulation layer 204 is provided to surround a resistive layer 202. The insulation layer 204 may include a silicon oxide or silicon nitride obtained by oxidizing or nitrifying a silicon thin film after deposition of the silicon thin film.

At this time, when the insulation layer 204 is to be thick, it is difficult to oxidize the silicon thin film at one time after the deposition of the silicon thin film. Therefore, a plurality of cycles of deposition and oxidization (or nitrification) may be performed to form the insulation layer 204 including multiple layers 204A to 204D.

Furthermore, the insulation layer 204 may include an insulation layer based on SiGe or GaAs. Furthermore, the insulation layer 204 may include an insulation layer formed by depositing a specific thin film, implanting oxygen ions or nitrogen ions into the thin film, and oxidizing or nitrifying the thin film.

In this embodiment of the present invention, the insulation layer 204 having a strain may be formed as the entire interlayer dielectric layer. According to an example, a typical dielectric material may be used as an interlayer dielectric layer, and the insulation layer 204 may be formed by forming a hole around a patterned memory cell (or around a resistor) and burying a material having a strain in the hole.

Referring to FIG. 3, an insulation layer 304 is provided to surround the memory element ME. The memory element ME may include a first electrode 300, a resistive layer 301, and a second electrode 302, which are stacked. The insulation layer 304 has a stacked structure of a first insulation layer 304A, a second insulation layer 304B, and a third insulation layer 304C. At this time, the second insulation layer 304B adjacent to the resistive layer 302 has a tensile strain. The second insulation layer 304B may be formed of a silicon oxide (or silicon nitride) obtained by depositing and oxidizing (or nitrifying) a thin film. The first and third insulation layers 304A and 304C may be formed of a dielectric layer having no strain and formed by a typical chemical vapor deposition (CVD) process. Here, the second insulation layer 304B having a strain may be formed of a dielectric layer based on SiGe and GaAs. Furthermore, the second insulation layer 304B may include an insulation layer formed by depositing a specific thin film, implanting oxygen ions or nitrogen ions into the thin film, and oxidizing or nitrifying the ion-implanted thin film.

Figure 4:
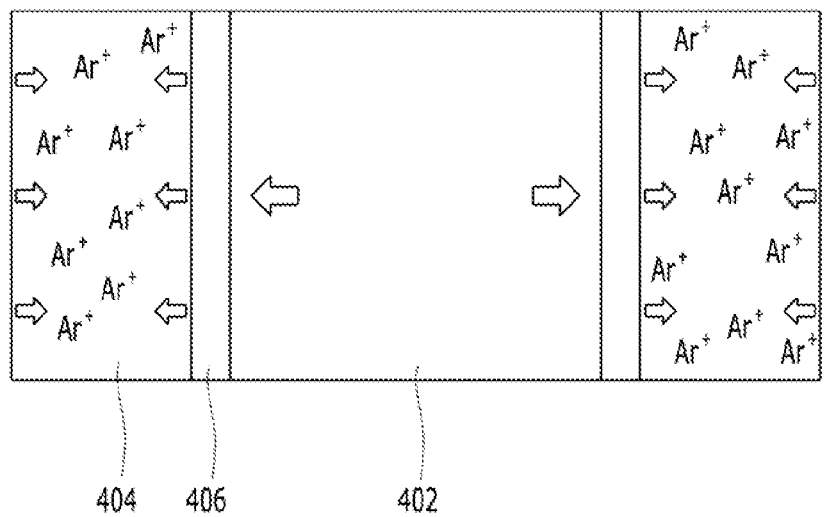
Figure 5:
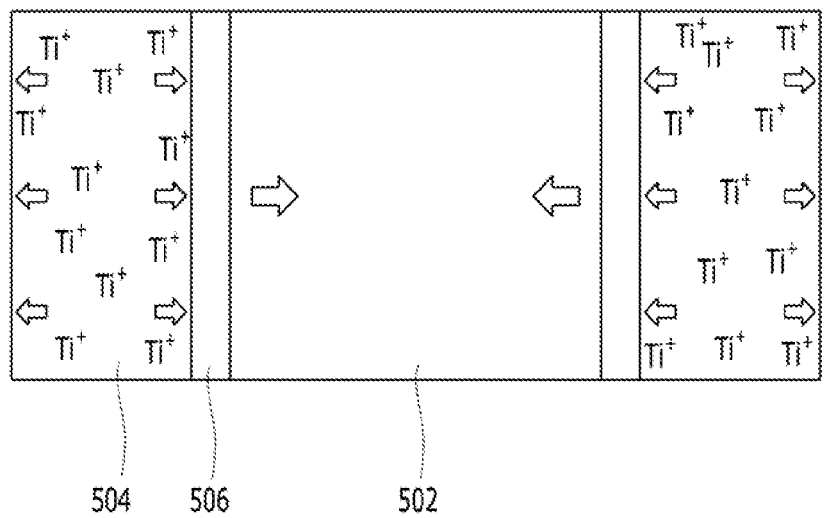

FIGS. 4 and 5 illustrate a case in which a strain is applied to a resistive layer by a thin film other than an insulation layer.

Referring to FIG. 4, a thin film 404 having a compressive strain (hereafter, referred to as "a strained thin film") is provided adjacent to a resistive layer 402. The strained thin film 404 has a compressive strain, as ions are implanted into the strained thin film 404. An insulation layer 406 may be formed between the resistive layer 402 and the strained thin film 404. The strained thin film 404 may be formed by implanting ions such as Ar+ into a crystalline thin film such as silicon, for example. In this case, since the strained thin film 404 receives a compressive strain, a tensile stress is applied to the resistive layer 402 surrounded by the strained thin film 404. The insulation layer 406 serves to insulate the resistive layer 402 and may be formed of an oxide or a nitride having an excellent insulation characteristic. When the insulation layer 406 is thick, the strain of the stained thin film 404 is not effectively transmitted to the resistive layer 402. Therefore, the insulation layer 406 may be designed to have a small thickness while maintaining insulation.

Referring to FIG. 5, a strained thin film 504 having a tensile strain is provided adjacent to a resistive layer 502. The strained thin film 504 has a tensile strain as ions are implanted into the stained thin film 504. An insulation layer 506 is interposed between the resistive layer 502 and the strained thin film 504. The strained thin film 504 may be formed by implanting ions such as Ti+ into a crystalline thin film such as silicon, for example. Since the strained thin film 504 has a tensile strain, the resistive layer 502 has a compressive strain. The insulation layer 506 serves to insulate the resistive layer 502, and may be formed of an oxide or a nitride having an excellent insulation characteristic. When the insulation layer 506 is thick, the strain of the stained thin film 504 is not effectively transmitted to the resistive layer 502. Therefore, the insulation layer 506 may be designed to have a small thickness while maintaining insulation.

Figure 6:
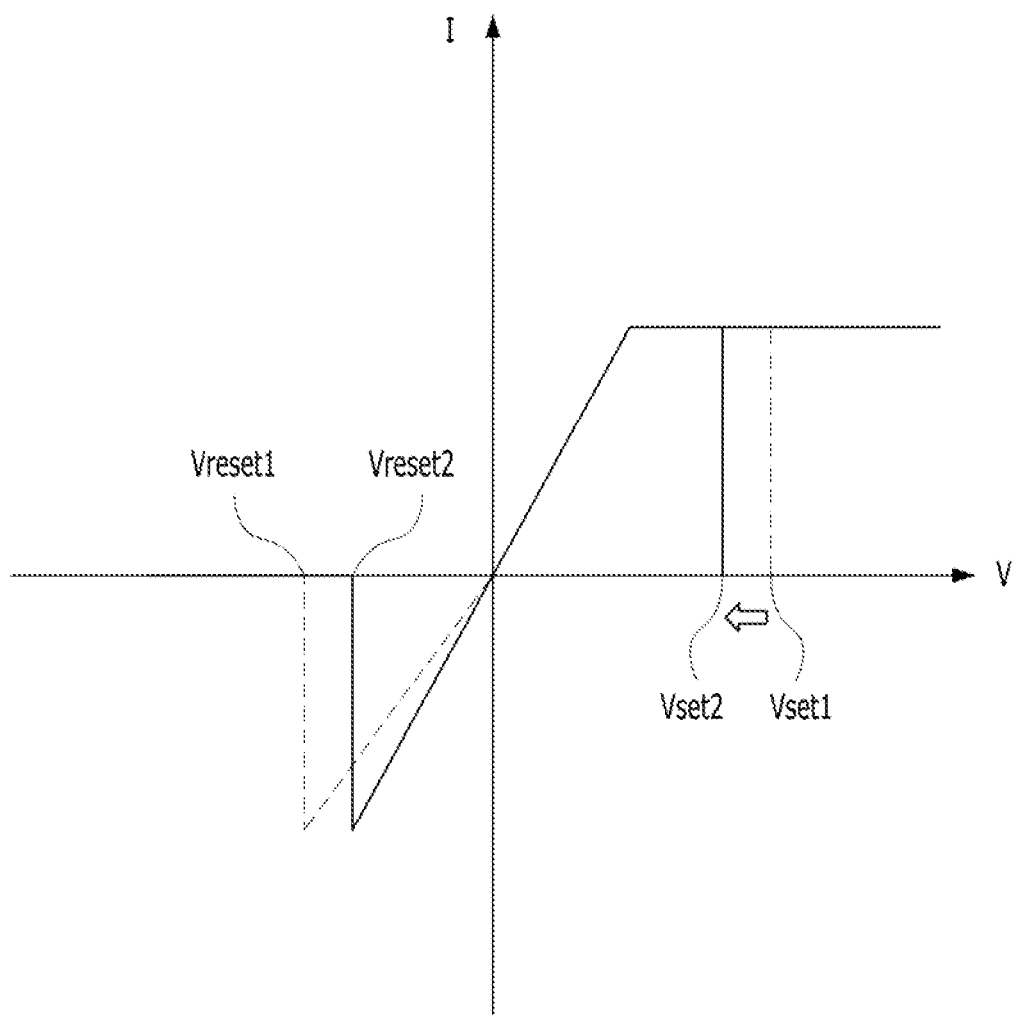
FIG. 6 is a current-voltage graph showing a switching characteristic of a memory element in accordance with the embodiment of the present invention.

FIG. 6 is a current-voltage graph showing the switching characteristic of the memory element in accordance with the embodiment of the present invention. Here, a case in which the embodiment of the present invention is applied to a bipolar ReRAM was taken as an example, for illustration purposes. However, the embodiment of the present invention may also be applied to a unipolar ReRAM. FIG. 6 shows that a set state occurs at a positive (+) bias and a reset state occurs at a negative (−) bias. Depending on ReRAM fabrication methods, the biases and switching directions for the set and reset states may be reversed with respect to each other.

In a conventional ReRAM, a switching characteristic of the ReRAM may be varied by changing a resistive layer material or electrode. However, when the resistive layer material or electrode is changed, other switching characteristics such as operation voltage, operation current, switching pass rate, and on/off ratio may be degraded.

In this embodiment of the present invention, the interlayer dielectric layer formed adjacent to the resistive layer is formed to have a strain. Therefore, as a complementary strain to the strain of the interlayer dielectric layer is applied to the resistive layer, the carrier mobility within the resistive layer may be improved. Accordingly, a set voltage Vset2 and a reset voltage Vreset2 in accordance with the embodiment of the present invention are reduced more than a set voltage Vset1 and a reset voltage Vreset1 in the conventional ReRAM.

Figure 7:
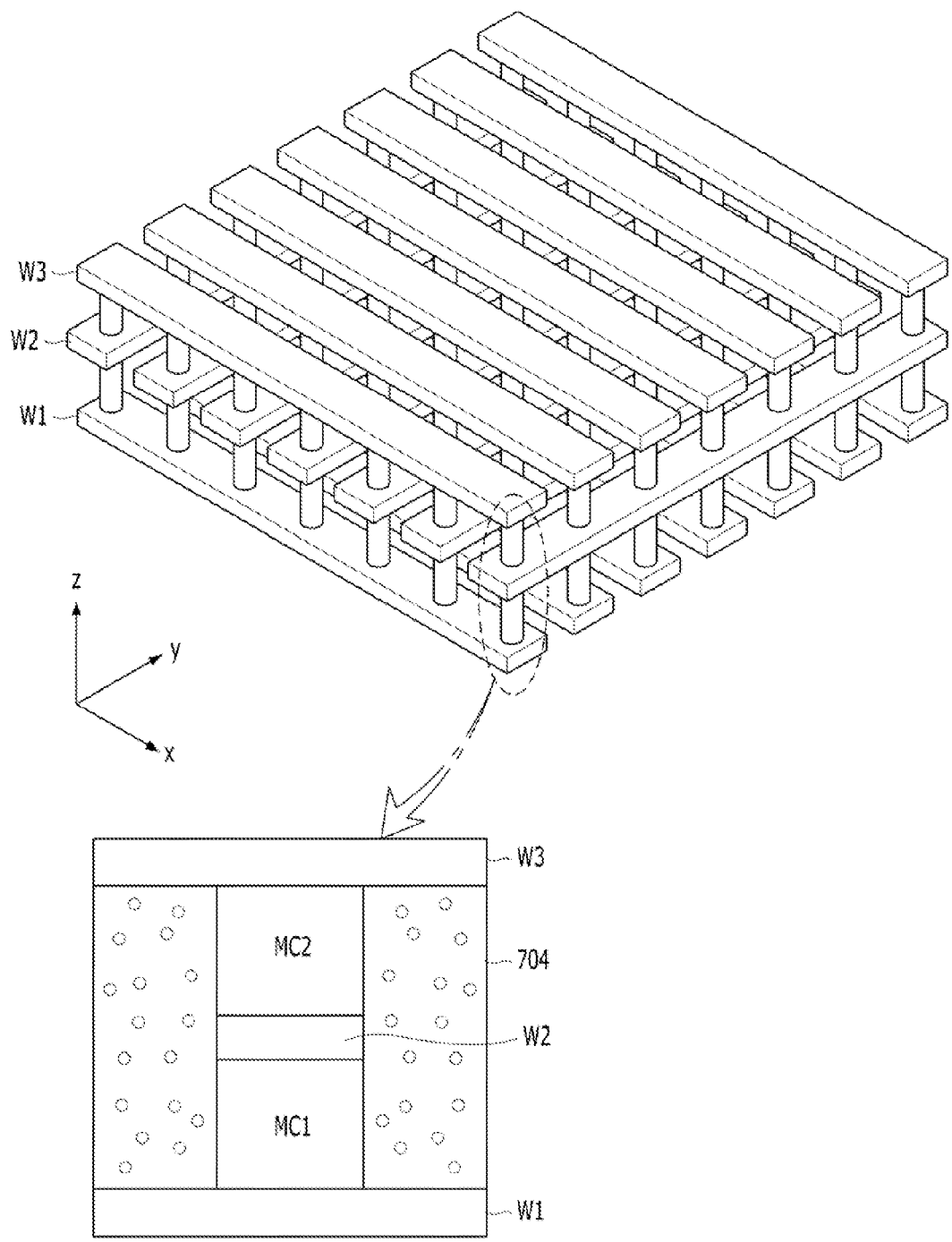
FIG. 7 illustrates that a resistive memory device having the memory elements in accordance with the embodiment of the present invention is three-dimensionally integrated.

FIG. 7 illustrates that a resistive memory device having the memory elements in accordance with the embodiment of the present invention is three-dimensionally integrated.

Referring to FIG. 7, a plurality of first conductive lines W1 are formed in parallel to each other in the X-axis direction, and a plurality of second conductive lines W2 are formed in parallel to each other in the Y-axis direction. The second conductive lines W2 are spaced at a desired distance from the first conductive lines W1 along the Z axis. At the respective intersection between the first and second conductive lines W1 and W2, a plurality of first memory cells MC1 are formed between the first and second conductive lines W1 and W2. Furthermore, a plurality of third conductive lines W3 are formed over the second conductive lines W2 so as to be spaced at a desired distance from the second conductive lines W2 along the Z axis. The third conductive lines W3 are formed in parallel to each other in the X-axis direction. At the respective intersection between the second and third conductive lines W2 and W3, a plurality of memory cells MC2 are formed between the second and third conductive lines W2 and W3. The surroundings of the patterns, the conductive lines, and the memory cells may be filled with a stained thin film 704. At this time, the strained thin film 704 may be used as an interlayer dielectric layer.

Here, each of the first and second memory cells MC1 and MC2 may include a memory element and a switching element. The memory element includes a resistive layer. The resistive layer may have a strain. Accordingly, the carrier mobility of the resistive layer is improved. Applying a strain to the resistive layer may be accomplished by forming the strained thin film 704 adjacent to the resistive layer. According to another example, unlike the configuration of FIG. 7, the strained thin film may be arranged only in a part of the space between the conductive lines so as to apply a strain, for example, only to the resistive layer.

Meanwhile, in the above embodiments, a case that a memory cell includes a resistive layer switched by movement of oxygen ions or oxygen vacancies is described. However, other embodiments are also possible. For example, a resistive layer of a memory cell may have an MTJ (Magnetic Tunnel Junction) structure which includes two magnetic layers and a tunnel insulating layer interposed therebetween. This will be exemplarily described with reference to FIGS. 8A to 10.

Figure 8A:
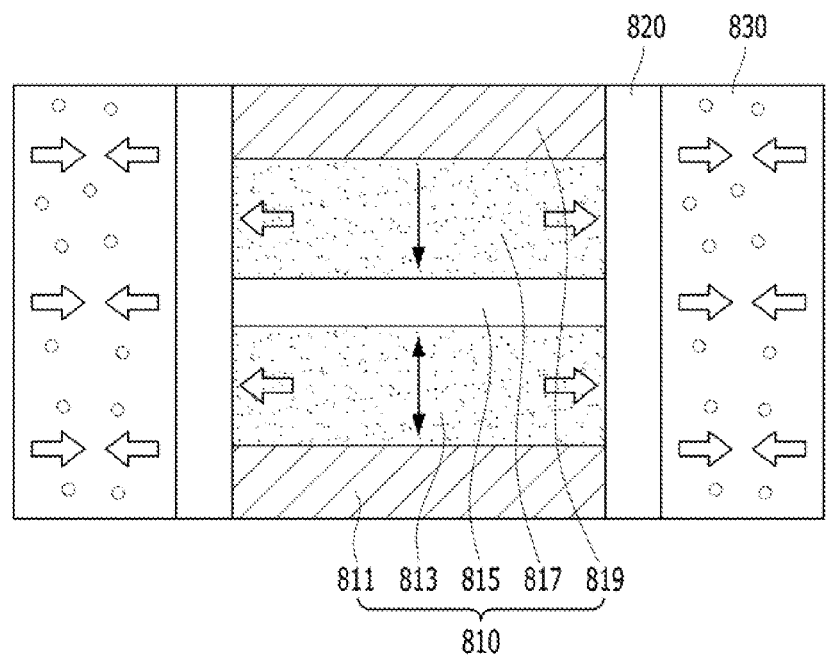
FIGS. 8A and 8B are cross-sectional views illustrating memory cells in accordance with another embodiment of the present invention and a fabricating method thereof.
Figure 8B:
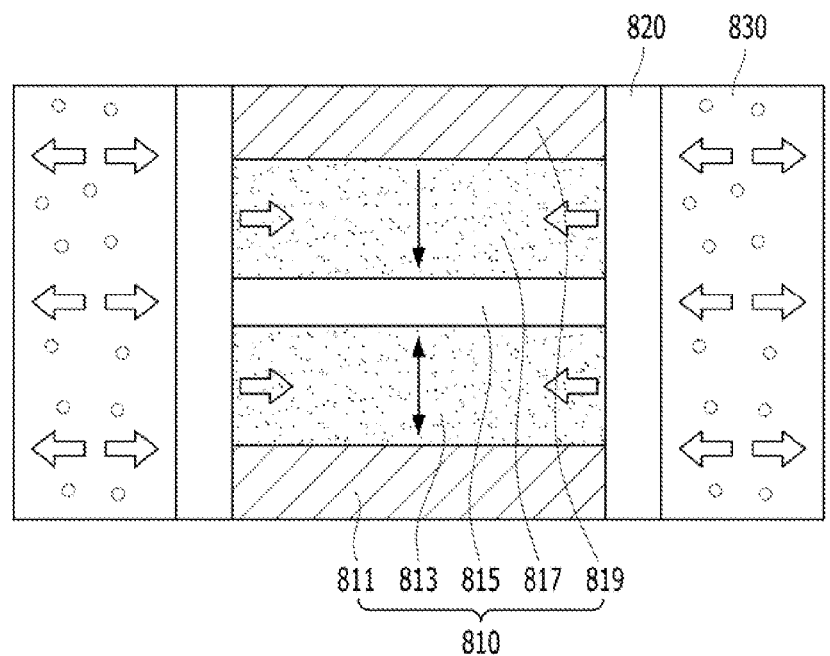

FIGS. 8A and 8B are cross-sectional views illustrating memory cells in accordance with another embodiment of the present invention and a fabricating method thereof.

Referring to FIGS. 8A and 8B, the memory cell of this embodiment may include a resistive layer 810 which is switched between different resistance states to store different data, a strained film 830 which is disposed over a sidewall of the resistive layer 810 and applies a strain to the resistive layer 810, and an insulating layer 820 which is interposed between the resistive layer 810 and the strained film 830 to separate them from each other.

Here, the resistive layer 810 may include a stack structure of a lower electrode 811, a first magnetic layer 813, a tunnel insulating layer 815, a second magnetic layer 817 and an upper electrode 819.

The lower electrode 811 and the upper electrode 819 may serve as coupling the resistive layer 810 with other elements (not shown), for example, a lower conductive contact and an upper conductive contact which are disposed under the resistive layer 810 and over the resistive layer 810, respectively. The lower electrode 811 and the upper electrode 819 may be formed of various conductive materials.

One of the first and second magnetic layers 813 and 817 may be a pinned layer having a pinned magnetization direction, and the other thereof may be a free layer having a variable magnetization direction. In this embodiment, the first magnetic layer 813 is a free layer and the second magnetic layer 817 is a pinned layer, and the magnetization directions of the first and second magnetic layers 813 and 817 are substantially perpendicular to surfaces thereof. Each of the first and second magnetic layers 813 and 817 may have a single-layered structure or multi-layered structure including a ferromagnetic material such as an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, etc.

The tunnel insulating layer 815 may change the magnetization direction of the free layer by the tunneling of electrons. The tunnel insulating layer 815 may have a single-layered structure or multi-layered structure including an oxide such as MgO, CaO, SrO, TiO, VO, NbO, etc.

Moreover, although not shown, the resistive layer 810 may further include one or more additional layers for improving characteristics of the MTJ structure.

When the magnetization directions of the free layer and the pinned layer are parallel to each other according to a voltage or current applied to the lower electrode 811 and the upper electrode 819, the resistive layer 810 may exhibit a low resistant state. On the other hand, when the magnetization directions of the free layer and the pinned layer are anti-parallel to each other, the resistive layer 810 may exhibit a high resistant state.

The strained film 830 may have a compressive strain (see FIG. 8A). Alternately, the strained film 830 may have a tensile strain (see FIG. 8B). When the strained film 830 has a compressive strain, the resistive layer 810 may have a tensile strain. When the strained film 830 has a tensile strain, the resistive layer 810 may have a compressive strain. When the resistive layer 810 includes the MTJ structure, a magnetic anisotropy characteristic Hk may be changed according to a strain applied to the resistive layer 810. This is because a magnetic material such as the first and second magnetic layers 813 and 817 of the resistive layer 810 has a magnetostriction effect, or its reverse effect, according to a strain. This characteristic is shown in a paper by Dexin Wang et al., "Magnetostriction effect of amorphous CoFeB thin films and application in spin-dependent tunnel junctions", JOURNAL OF APPLIED PHYSICS 97, 10C906, 2005. Therefore, in this embodiment, a strain may be applied to a magnetic material included in the resistive layer 810, for example, the first magnetic layer 813 and/or the second magnetic layer 817 by providing the strained film 810 over the sidewall of the resistive layer 810. A type and/or a magnitude of the strain applied to the resistive layer 810 for obtaining a optimal Hk may be determined according to a type, a composition and/or a crystalline direction of the magnetic material included in the resistive layer 810.

In this embodiment, the strained film 830 may be formed of a semiconductor material such as silicon including ions implanted thereto, for example, Ar+ ions or Ti+ ions. In this case, the insulating layer 820 may be interposed between the strained film 830 and the resistive layer 810 in order to insulate the strained film 830 and the resistive layer 810 from each other. If the strained film 830 is formed of an insulating material having a strain, the insulating layer 820 may be omitted.

A fabricating method of the above-described memory cell will be described briefly, as follows.

First, material layers for forming the lower electrode 811, the first magnetic layer 813, the tunnel insulating layer 815, the second magnetic layer 817 and the upper electrode 819 may be formed over a substrate (not shown) having required elements. Then, the resistive layer 810 having a pillar shape may be formed by patterning the material layers. Then, the insulating layer 820 may be deposited over the sidewall of the resistive layer 810. Then, the strained film 830 may be formed over a sidewall of the insulating layer 820 by depositing a semiconductor layer, for example, a crystalline silicon layer, and performing an ion-implantation process and a heat treatment process to the semiconductor layer.

Meanwhile, in the embodiments of FIGS. 8A and 8S, a case that the strained film 830 applies a strain to an entire sidewall of the resistive layer 810 is described. However, other embodiments are also possible. For example, the strained film 830 may apply a strain to a required portion of the resistive layer 810, for example, a magnetic material. This will be exemplarily described with reference to FIGS. 9 and 10.

Figure 9:
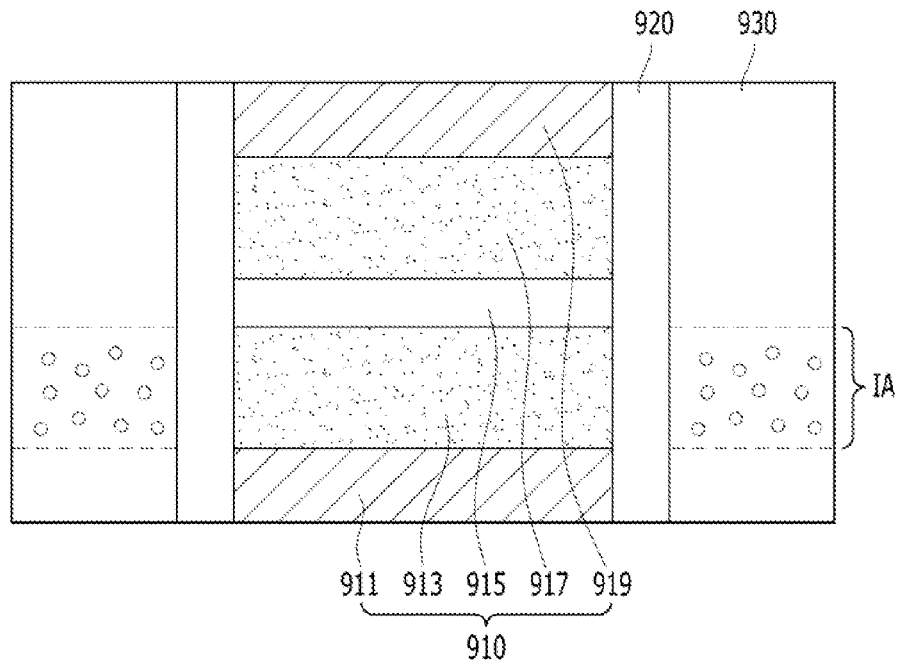
FIG. 9 is a cross-sectional view illustrating a memory cell in accordance with still another embodiment of the present invention and a fabricating method thereof.

FIG. 9 is a cross-sectional view illustrating a memory cell in accordance with still another embodiment of the present invention and a fabricating method thereof.

Referring to FIG. 9, the memory cell of this embodiment may include a resistive layer 910 including a stack structure of a lower electrode 911, a first magnetic layer 913, a tunnel insulating layer 915, a second magnetic layer 917 and an upper electrode 919, a strained film 930 which is disposed over a sidewall of the resistive layer 910 and applies a strain to the resistive layer 910, and an insulating layer 920 which is interposed between the resistive layer 910 and the strained film 930 to separate them from each other.

Here, the strained film 930 may apply a strain to a portion of the resistive layer 810 which requires the strain. That is, the strained film 930 may include a strain area IA corresponding to the portion of the resistive layer 910, and a remaining area of the strained film 930 may not have a strain. For example, when the first magnetic layer 913 of the resistive layer 910 requires a strain, the strained film 930 may have the strain area IA corresponding to the first magnetic layer 913 and the remaining area which does not have a strain.

The strained film 930 may be formed by depositing a semiconductor layer, for example, a crystalline silicon layer over the sidewall of the resistive layer 910, and performing an ion-implantation process to a portion of the semiconductor layer, for example, an area corresponding to the first magnetic layer 913. As a result, the strain area IA containing the implanted ions may formed in the strained film 930. A remaining area of the strained film 930, except for the strain area IA, may be the semiconductor layer which does not contain the implanted ions. Then, a heat treatment may be performed.

Figure 10:
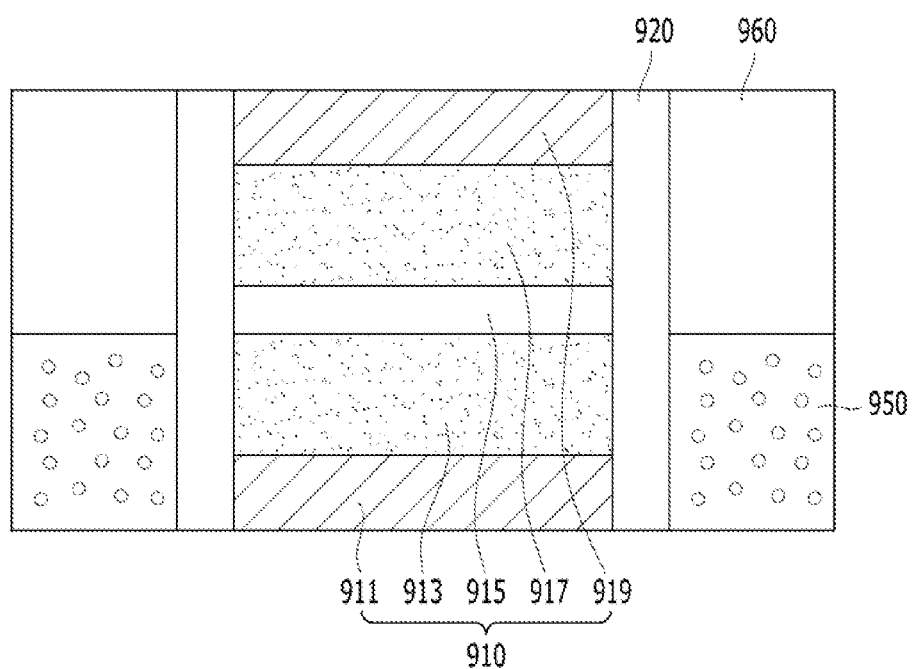
FIG. 10 is a cross-sectional view illustrating a memory cell in accordance with still another embodiment of the present invention and a fabricating method thereof.

FIG. 10 is a cross-sectional view illustrating a memory cell in accordance with still another embodiment of the present invention and a fabricating method thereof.

Referring to FIG. 10, the memory cell of this embodiment may include a resistive layer 910 including a stack structure of a lower electrode 911, a first magnetic layer 913, a tunnel insulating layer 915, a second magnetic layer 917 and an upper electrode 919, a strained film 950 which is disposed over a portion of a sidewall of the resistive layer 910 and applies a strain to the resistive layer 910, a non-strained film 960 which is disposed over a remaining portion of a sidewall of the resistive layer 910 and does not apply a strain to the resistive layer 910, and an insulating layer 920 which is interposed between the resistive layer 910 and the strained film 950 to separate them from each other. In this embodiment, the insulating layer 920 is further formed between the non-strained film 960 and the resistive layer 910. However, in other embodiments, the insulating layer 920 may be omitted between the non-strained film 960 and the resistive layer 910.

Here, the strained film 950 may be formed to correspond to a portion of the resistive layer 910 which requires the strain. For example, when the first magnetic layer 913 of the resistive layer 910 requires a strain, the strained film 950 may correspond to the first magnetic layer 913. In this embodiment, according to fabricating processes, the strained film 950 may correspond to the lower electrode 911, as well as the first magnetic layer 913.

The strained film 950 may be formed by depositing a semiconductor layer, for example, a crystalline silicon layer over the entire sidewall of the resistive layer 910, performing an ion-implantation process and a heat treatment process to the entire semiconductor layer, and removing an upper portion of the ion-implanted semiconductor layer. Then, the non-strained film 960 may be formed by depositing an insulating material, which does not have a strain, over the strained film 950. By this embodiment, diffusion of the ions may be prevented during the heat treatment.

While the present invention has been described with respect to the specific embodiments, it will be apparent to those skilled in the art that various changes and modifications may be made without departing from the spirit and scope of the invention as defined in the following claims.

What is claimed is:

1. A resistive memory device comprising:
   a resistive layer which includes a first magnetic layer, a second magnetic layer, and a tunnel insulating layer interposed between the first magnetic layer and the second magnetic layer, and is switched between different resistance states; and
   a strained film formed over a sidewall of the resistive layer and applying a strain to the resistive layer,
   wherein the strained film includes a semiconductor material containing ions implanted therein.

2. The resistive memory device of claim 1, wherein a magnetic anisotropy of the resistive layer is changed according to the strain applied to the resistive layer.

3. The resistive memory device of claim 1, wherein the strained film includes a strain area which corresponds to a portion of the resistive layer and has a strain, and a non-strain area which corresponds to a remaining portion of the resistive layer and does not have a strain, and
   the strain area includes the semiconductor material containing ions implanted therein.

4. The resistive memory device of claim 3, wherein the portion of the resistive layer is at least one of the first magnetic layer and the second magnetic layer.

5. The resistive memory device of claim 3, wherein the non-strain area includes a semiconductor material which does not contain ions.

6. The resistive memory device of claim 3, wherein the non-strain area includes an insulating material.

7. The resistive memory device of claim 1, wherein the strained film has a compressive strain and the resistive layer has a tensile strain.

8. The resistive memory device of claim 1, wherein the strained film has a tensile strain and the resistive layer has a compressive strain.

9. The resistive memory device of claim 1, further comprising:
   an insulating layer interposed between the strained film and the resistive layer.

10. The resistive memory device of claim 1, wherein the strained film includes Ar+ ions.

11. The resistive memory device of claim 1, wherein the strained film includes Ti+ ions.

12. The resistive memory device of claim 1, wherein the semiconductor material is a silicon.

13. The resistive memory device of claim 1, wherein a resistance state of the resistive layer is switched according to whether magnetization directions of the first and second magnetic layers are parallel or anti-parallel.

* * * * *